United States Patent [19]

Noufer

[11] Patent Number: 4,546,453
[45] Date of Patent: Oct. 8, 1985

[54] FOUR-STATE ROM CELL WITH INCREASED DIFFERENTIAL BETWEEN STATES

[75] Inventor: Glenn E. Noufer, Austin, Tex.

[73] Assignee: Motorola, Inc., Schaumburg, Ill.

[21] Appl. No.: 391,031

[22] Filed: Jun. 22, 1982

[51] Int. Cl.$^4$ .................. G11C 11/40; G11C 13/00
[52] U.S. Cl. .................................. 365/104; 365/45
[58] Field of Search ............ 357/23 MG, 23 VT, 42, 357/68; 365/94, 103, 104

[56] References Cited

U.S. PATENT DOCUMENTS

| | | | |
|---|---|---|---|
| T979,006 | 2/1979 | Hadamard | 357/68 X |
| 3,914,855 | 10/1985 | Cheney et al. | 357/41 X |
| 4,025,940 | 5/1977 | Kimura et al. | 357/23 MG |
| 4,087,795 | 5/1978 | Rossler | 365/185 |
| 4,192,014 | 3/1980 | Craycraft | 365/104 |
| 4,272,830 | 6/1981 | Moench | 365/104 X |

FOREIGN PATENT DOCUMENTS

| | | | |
|---|---|---|---|
| 2445079 | 4/1976 | Fed. Rep. of Germany | 257/23 VT |
| 45-36051 | 11/1970 | Japan | 357/23 R |

Primary Examiner—Joseph A. Popek
Attorney, Agent, or Firm—Anthony J. Sarli, Jr.; Jeffery Van Myers; James L. Clingan, Jr.

[57] ABSTRACT

A four-state ROM cell is improved by providing a tapered potential gate area which allows for the effective gate width to be increased and the gate length to be decreased for each succeedingly higher gain state with a single program mask at the polysilicon gate deposition stage.

3 Claims, 7 Drawing Figures

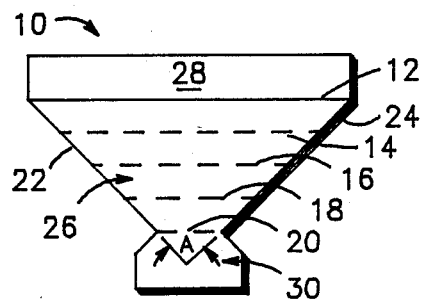
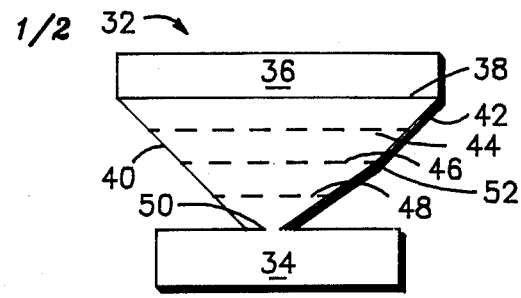
*FIG. 1A*  *FIG. 2*
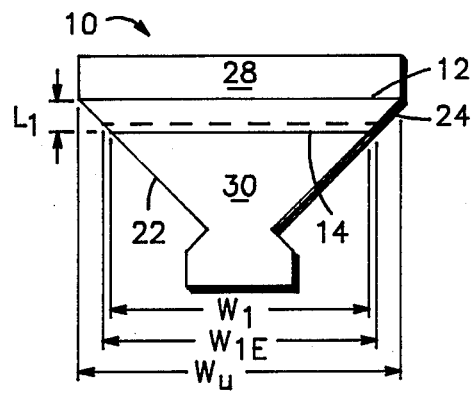
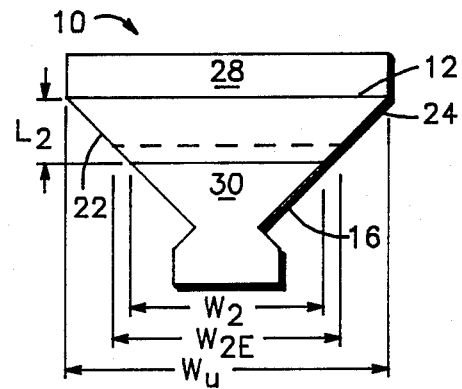
*FIG. 1B*  *FIG. 1C*
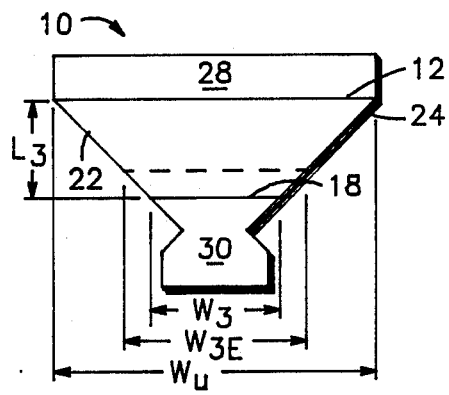
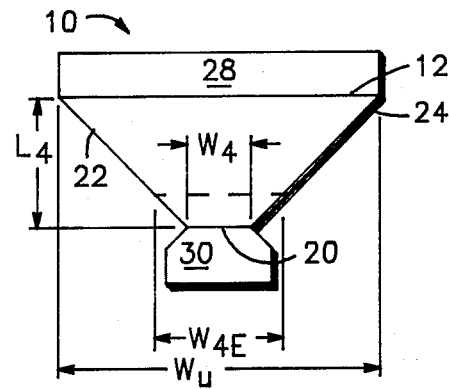
*FIG. 1D*  *FIG. 1E*

FOUR-STATE ROM CELL WITH INCREASED DIFFERENTIAL BETWEEN STATES

FIELD OF THE INVENTION

This invention relates to read only memory cells, and more particularly, to read only memory cells which can be programmed to more than the two states.

BACKGROUND OF THE INVENTION

In an attempt to make read only memory (ROM) arrays more dense, read only memory cells capable of being programmed to more than the two states typical for a ROM have been developed. As a practical matter and for convenience such cells are normally chosen to have four possible states although some other number of states can be chosen. For example, U.S. Pat. No. 4,327,424 to Philip T. Wu describes a three state cell. There are two primary approaches to developing a more-than-two-state transistor cell for MOS technology ROMs. One approach is to vary threshold voltages for the differing states. Because the threshold voltage of an MOS transistor is determined by the concentration of dopant in the channel, each additional state beyond the normal two states requires not only an additional process step for doping the selected channels but an additional program mask for masking the dopant from the unselected channels as well. The second approach has a transistor cell with a gain selected from more than two possible gains. The gain is directly related to the width to length ratio of the gate of the transistor. One of either the length or width is varied to achieve the desired variation in gain. U.S. Pat. No. 4,272,830 to Jerry D. Moench describes such an approach. Advantages are that no additional programming steps are required, and the one necessary programming step is relatively late in the process. A disadvantage is that in order to obtain sufficient gain differential for reliable detection of the state of the cell, the cell must be relatively large to accommodate the potential gate dimensions because only one of the length and width is varied.

SUMMARY OF THE INVENTION

An object of the invention is to provide an improved more-than-two-state ROM cell.

A further object is to provide a ROM cell which has a potential gate area of variable length and width.

Yet another object is to provide a ROM cell which has a potential gate area of variable length and width, both of which are selected by a single program mask.

And yet another object is to provide a transistor ROM cell with a potential gate area which is tapered toward one of the source and drain.

These and other objects of the invention are carried out by a read only memory cell comprising a transistor having a first current electrode, a second current electrode, and a control electrode of a predetermined width and length, wherein the cell is capable of being programmed into more than two states as determined by the width and length of the control electrode, the control electrode having a potential area between the first and second current electrodes, the potential control electrode area characterized as being tapered between the first and second current electrodes.

BRIEF DESCRIPTION OF THE DRAWINGS

FIG. 1a is a topographical view of a memory cell according to the invention showing four possible gain states.

FIG. 1b is a topographical view of the memory cell of FIG. 1a in a high gain state.

FIG. 1c is a topographical view of the memory cell of FIG. 1a in a medium-high gain state.

FIG. 1d is a topographical view of the memory cell of FIG. 1a in a medium-low gain state.

FIG. 1e is a topographical view of the memory cell of FIG. 1a in a low-gain state.

FIG. 2 is a topographical view of a memory cell having an accelerated taper according to the invention and showing four possible gain states.

DETAILED DESCRIPTION OF THE DRAWINGS

Figure 3:
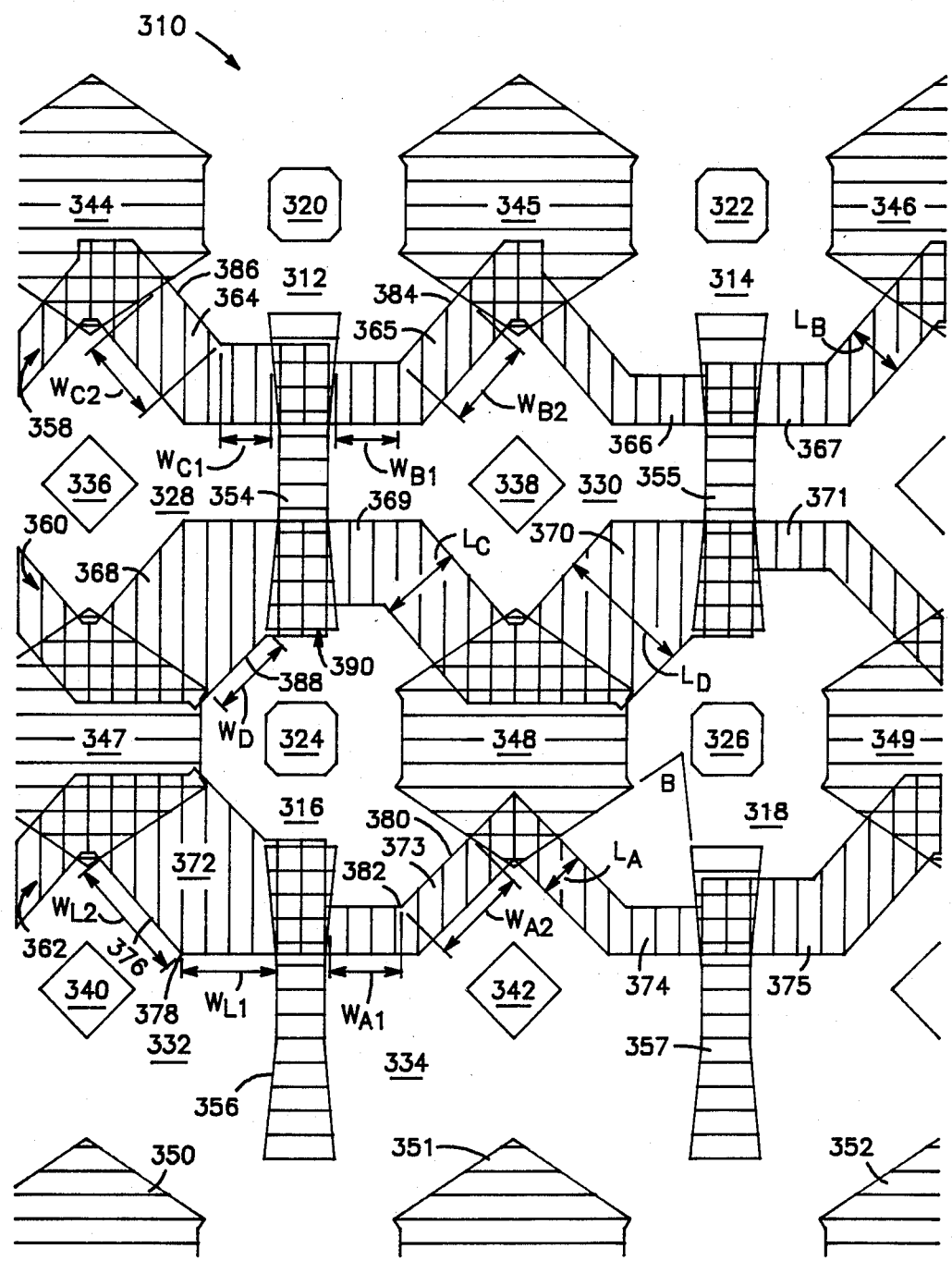
FIG. 3 is a topographical view of a portion of an array of memory cells according to a preferred embodiment of the invention.

Shown in FIG. 1a is a transistor memory cell 10 having four possible gain states, the selection of which is achieved by choosing one of four possible gate areas. The four gate areas are between an upper boundary 12 and one of a high gain line 14, a medium-high gain line 16, a medium-low gain line 18, and a low-gain line 20. The four gain states, in order of decreasing gain, comprise a high gain state, a medium-high gain state, a medium-low gain state, and a low gain state which correspond to gate areas bounded by high gain line 14, medium-high gain line 16, medium-low gain line 18, and low gain line 20, respectively. Each gate area is also between a left boundary 22 and a right boundary 24. A total area available for making a gate is potential gate area 26 which is bounded by upper boundary 12, low gain line 20, left boundary 22, and right boundary 24. In this case potential gate area 26 is the same as the gate area for the low gain state because upper boundary 12 is a boundary for the gate area for each gain state. Left boundary 22 and right boundary 24 as shown are linearly tapered at an angle A from a drain region 28 to a source region 30. Regions 28 and 30 are designated drain and source respectively, for the likely current electrode function of the two regions but can in fact be interchanged so that either region can function as a source or drain.

FIG. 1b shows cell 10 in the high gain state with a gate area bounded by left boundary 22, right boundary 24, high gain line 14, and upper boundary 12 over which is applied polysilicon to form a gate. Dopant is then applied in a conventional self-aligning process forming a source and a drain in source and drain regions 30 and 28, respectively. Only a single mask for applying the polysilicon gate is required. Gain of a MOS transistor is directly related to the width to length ratio of the gate. Due to the tapering of the potential gate area toward source region 30, the high gain state cell shown in Fig. 1b does not have a uniform width. Instead, it has a long width $W_u$ at upper boundary 12 and a short width $W_1$ at high gain line 14. Experiment has shown that an effective width of a tapered gate is a function of the short and long widths, but is more heavily weighted toward the short width. For a linear taper as shown in FIG. 1a, an effective width $W_{1E}$ is located approximately three-fourths of the way from upper boundary 12 to high gain line 14 and the calculation for obtaining an approximation of effective gate width $W_{1E}$ is as follows:

$$W_{1E}=(3W_1+W_u)/4 \qquad (1)$$

A gate length $L_1$ is measured from upper boundary 12 to high gain line 14. A gain $G_1$ of the high gain state is directly proportional to $W_{1E}/L_1$.

FIG. 1c shows cell 10 in a medium-high gain state with a gate area bounded by upper boundary 12, medium-high gain line 16, right boundary 24, and left boundary 22 over which is applied polysilicon to form a gate. Dopant is then applied in a conventional self-aligning process forming a source and a drain in source and drain regions 30 and 28, respectively. As in the high gain state depicted in FIG. 1b, only a single mask is required for applying the polysilicon gate. Because medium-high gain line 16 is further along the taper, the gate has a length $L_2$ which is longer than length $L_1$. An effective width $W_{1E}$ is related to long width $W_u$ and a short width $W_2$ by the following approximation:

$$W_{2E}=(3W_2+W_u)/4 \qquad (2)$$

A gain $G_2$ of the medium-high gain state is directly proportional to $W_{2E}/L_2$. Gain $G_2$ is smaller than Gain $G_1$ because effective gate width $W_{2E}$ is less than effective gate width $W_{1E}$ and gate length $L_2$ is greater than gate length $L_1$. So the gain differential between gains $G_1$ and $G_2$ is impacted not by just a difference in one of the gate length and width but by both a decrease in width and an increase in length to obtain the gain decrease.

FIG. 1d shows cell 10 in a medium-low gain state with a gate area bounded by upper boundary 12, medium-low gain line 18, right boundary 24, and left boundary 22 over which is applied polysilicon to form a gate. Dopant is then applied in a conventional self-aligning process forming a source and a drain in source and drain regions 30 and 28, respectively. As in the high and medium-high gain states depicted in FIGS. 1b and 1c, respectively, only a single mask is required for applying the polysilicon gate. Because medium-low line 18 is further along the taper than medium-high line 16, the gate has a length $L_3$ which is longer than length $L_1$. An effective width $W_{3E}$ is related to long width $W_u$ and a short width $W_3$ by the following approximation:

$$W_{3E}=(3W_3+W_u)/4 \qquad (3)$$

A gain $G_3$ of the medium-low gain state is directly proportional to $W_{3E}/L_3$. Gain $G_3$ is smaller than gain $G_2$ because effective gate width $W_{3E}$ is less than effective gate width $W_{2E}$ and gate length $L_3$ is greater than length $L_2$. So the gain differential between gains $G_3$ and $G_2$ is impacted not by just a difference in one of the gate length and width but by both a decrease in width and an increase in length to obtain the gain decrease.

FIG. 1e shows cell 10 in a low gain state with a gate area bounded by upper boundary 12, low gain line 20, right boundary 24, and left boundary 22 over which is applied polysilicon to form a gate. Dopant is then applied in a conventional self-aligning process forming a source and a drain in source and drain regions 30 and 28, respectively. As in the high, medium-high, and medium-low gain states depicted in FIGS. 1b, 1c, and 1d, respectively, only a single mask is required for applying the polysilicon gate. Because low gain line 20 is further along the taper than the medium-low line 18, the gate has a length $L_4$ which is longer than length $L_3$. An effective width $W_{4E}$ is related to long width $W_u$ and a short width $W_4$ by the following approximation:

$$W_{4E}=(3W_4+W_u)/4 \qquad (4)$$

A gain $G_4$ of the low gain state is directly proportional to $W_{4E}/L_4$. Gain $G_4$ is smaller than gain $G_3$ because effective gate width $W_{4E}$ is less than effective gate width $W_{3E}$ and gate length $L_4$ is greater than gate length $L_3$. So the gain differential between gains $G_4$ and $G_3$ is impacted by both a decrease in width and an increase in length to obtain the gain decrease. Consequently, with a single program mask, any one of four unique gate areas are formed over potential gate area 26, and each unique gate area has an effective width and length which differ from the other gate areas.

Shown in FIG. 2 is a cell 32 which is substantially the same as cell 10 in FIG. 1a having a source region 34, a drain region 36, an upper boundary 38, a left boundary 40, a right boundary 42, and four gain lines 44, 46, 48, and 50 each for establishing a different gain state. The difference in cell 32 from cell 10 lies in a right boundary 42 which has a discontinuity at point 52 whereat the rate of taper of left and right boundaries 40 and 42 is accelerated. Left boundary 40 could be changed in shape as well but still taper with right boundary 42. Other possible shapes which could taper include but are not limited to curves and staircase shapes. Still other shapes may be used which allow for simultaneous variations in length and width of gate area may be selected, for example a hexagonal shape or a shape defined by a discontinuous curve or line.

Shown in FIG. 3 is a portion of a ROM cell array 310 which uses tapered potential gate areas to form transistor cells of four different gain states. Array 310 has four source regions 312, 314, 316, and 318 of N+ material with metal contacts 320, 322, 324, and 326, respectively, and four drain regions 328, 330, 332, and 334 of N+ material with metal contacts 336, 338, 340, and 342, respectively. Metal contacts 336 and 340 are for connecting drain regions 328 and 332 to a first metal bit sense line. Metal contacts 338 and 342 are for connecting drain regions 330 and 334 to a second metal bit sense line. Metal contacts 320 and 324 are for connecting source regions 312 and 316 to a first metal virtual ground line. Metal contacts 322 and 326 are for connecting source regions 314 and 318 to a second metal virtual ground line.

To the left and right of each source region 312, 314, 316, and 318 are substantially diamond shaped regions of field oxide. Shown are oxide regions 344, 345, 346, 347, 348, 349, 350, 351 and 352. To the left and right of each drain region 328, 330, 332, and 334 are substantially bow-tie shaped regions of field oxide. Shown also are oxide regions 354, 355, 356, and 357. The location of oxide regions 344–352 and oxide regions 354–357 establish distinct paths between source regions 312, 314, 316, and 318 and drain regions 328, 330, 332, and 334 in a conventional X cell configuration. The shape, however, of oxide regions 344–352 and oxide regions 354–357 provide a unique taper which allows for formation of one of a high gain, a medium-high gain, a medium-low gain, and a low gain transistor cell between each source 312, 314, 316, and 318 and drain 328, 330, 332, and 334.

Each path is tapered at an angle B. For example, the path formed by oxide regions 348 and 357 is tapered from drain region 334 to source region 318 at angle B. Transverse to each path between each source 312, 314, 316 and 318 and drain 328, 330, 332, and 334 is a channel region caused by rows of polysilicon in a conventional self-aligning gate process. Shown are 3 rows, 358, 360, and 362 of polysilicon. Shown are four gate areas 364, 365, 366, and 367 formed by row 358; four gate areas 368, 369, 370, and 371 formed by row 360; and four gate areas 372, 373, 374, and 375 formed by row 362. Each gate area 364–375 determines a transistor of one of high, medium-high, medium-low, and low gain.

For example, a high gain transistor is formed by gate area 373 between source region 316, and drain region 334. Other high gain transistors are formed by gate areas 366, 371, and 374 with the same dimensions as gate area 373. Each gate area 364–375 has a boundary adjacent a drain region and a boundary adjacent a source region. For example, gate area 372 has a drain boundary 376 adjacent drain region 332 and between diamond shaped oxide region 347 and bow tie shaped oxide region 356. A portion of drain boundary 376 extends perpendicular to the longitudinal axis of oxide region 356 from oxide region 356 to a point 378 whereat drain boundary 376 changes direction by 45° to reach diamond shaped oxide 347. Gate area 372 has a drain boundary dimension from bow-tie shaped oxide 356 to point 378 of $W_{L1}$ and from point 378 to diamond shaped oxide region 347 of $W_{L2}$. Each gate area 364–375 has the same drain boundary dimensions of $W_{L1}$ and $W_{L2}$ the sum of which is a total drain boundary dimension of $W_1$. Consequently, the source boundary dimension correlates to the relative gain of the transistors formed by gate areas 364–375. For each gate area 364–375, the source boundary is parallel to the drain boundary.

A source boundary 380 of gate area 373 adjacent to source region 316 has a dimension $W_{A1}$ from oxide region 356 to a point 382 and a dimension $W_{A2}$ from point 382 to oxide 348. Each high gain gate area 366, 371, 373, and 374 have the same boundary dimensions of $W_{A1}$ and $W_{A2}$ the sum of which is a total source boundary dimension of $W_A$. A medium-high gain transistor formed by gate area 365 between source region 312 and drain region 330 has a source boundary 384 of dimensions of $W_{B1}$ and $W_{B2}$ measured in the same way as for high gain gate area 373. Each medium-high gain gate area 365 and 367 have the same source boundary dimensions $W_{B1}$ and $W_{B2}$ the sum of which is a total source boundary dimension $W_B$. A medium-low gain transistor formed by gate area 364 between source region 312 and drain region 328 has a source boundary 386 of dimensions $W_{C1}$ and $W_{C2}$ measured in the same way as for gate areas 373 and 365. Each medium-low gain gate area 364, 369, and 375 have the same source boundary dimensions $W_{C1}$ and $W_{C2}$ the sum of which is a total source boundary dimension $W_C$.

A low gain transistor formed by gate 368 between source region 316 and drain region 328 has a source boundary 388 which is measured slightly differently than for other gain states. A portion 390 of gate area 368 is between oxide 354 and source region 316 which has a neglible effect as a gate. Accordingly, source boundary 388 has an effective dimension of $W_D$ between oxide 347 and 354 at their closest points.

Associated with each gain state is a source boundary dimension and a drain boundary dimension with the drain boundary dimension $W_L$ being the same for all the gain states as well as being greater than each of the four source boundary dimensions $W_A$, $W_B$, $W_C$, and $W_D$. Due to the taper of the potential gate area $W_A$ is greater than $W_B$ which is greater than $W_C$ which is greater than $W_D$, partially accounting for the reduced gain. Each gain state has an effective gate width proportional to its associated source boundary dimension and the drain boundary dimension. An approximate effective gate width $W_{AE}$ for the high gain state is calculated as follows:

$$W_{AE} = (3W_A + W_L)/4 \tag{5}$$

An approximate effective gate width $W_{BE}$ for the medium-high gain state is calculated as follows:

$$W_{BE} = (3W_B + W_l)/4 \tag{6}$$

An approximate effective gate width $W_{CE}$ for the medium-low gain state is calculated as follows:

$$W_{CE} = (3W_C + W_L)/4 \tag{7}$$

An approximate effective gate width $W_{DE}$ for the low gain state is calculated as follows:

$$W_{DE} = (3W_D + W_L)/4 \tag{8}$$

Each gain state has a different gate length as well as a different gate width. A gate length $L_A$ for the high gain states is shown, for example, for gate area 374 bounded by source region 318 and drain region 334. Similarly, a gate length $L_B$ for the medium-high gain states, a gate length $L_C$ for the medium-low gain states, and a gate length $L_D$ for the low gain states are shown, for example, for gate areas 367, 369, and 370, respectively.

For a calculation of the gains of the gain states for comparative purposes, the effective width is divided by the length. Consequently, for the purpose of comparing the relative gains of the four gain states, the high gain state is $W_{AE}/L_A$, the medium-high gain state is $W_{BE}/L_B$, the medium-low gain state is $W_{CE}/L_C$, and the low gain state is $W_{DE}/L_D$. These ratios can be manipulated as desired by varying the lengths $L_A$, $L_B$, $L_C$, and $L_D$; width portions $W_{A1}$, $W_{A2}$, $W_{B1}$, $W_{B2}$, $W_{C1}$, $W_{C2}$, $W_{D1}$, $W_{D2}$, $W_{L1}$, and $W_{L2}$ for determining the effective gate widths, and angle B of the taper of the potential gate area. In A ROM in which the high gain transistor is biased with a gate voltage of 3.9 volts and a source at essentially ground to produce a drain voltage at approximately 2.9 volts, for sense amplifier detection by a differential amplifier, the following are the dimensions (in microns), for example, for useful gain separation of the four gain states: $L_A=2.0$, $L_B=2.5$, $L_C=3.4$, $L_D=5.25$ $W_{A1}=3.10$, $W_{A2}=3.75$, $W_{B1}=2.75$, $W_{B2}=3.5$ $W_{C1}=2.35$, $W_{C2}=2.9$, $W_D=3.25$, $W_{L1}=4.2$, $W_{L2}=5.0$ The angle B of taper is, for example, 64°.

While the invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

I claim:

1. A read only memory cell comprising a tansistor having a first current electrode, a second current electrode, and a control electrode of a predetermined width and length, wherein the cell is capable of being programmed into more than two states as determined by the width and length of the control electrode, the control electrode having a potential area between the first and second current electrodes, the potential control electrode area characterized as allowing variation of both width and length with a single program mask, and the control electrode characterized as having a length selected from a group of at least 3 possible lengths.

2. A method of programming a read only memory transistor cell, comprising the steps of: defining an active region on a semiconductor substrate which has a tapered portion between potential source and drain regions; applying a conductor of a selected one of at least three predetermined widths across the tapered portion of the active region; and doping the active region using the conductor as a mask to form a source in the potential source region and a drain in the potential drain region.

3. An array of transistor memory cells wherein each transistor is capable of being programmed into one of at least three gain states as determined by a gate area thereof of a predetermined effective width and length, comprising:

a first transistor formed in a first active region having a source, a drain, a gate, and a channel region, wherein the first active region has a tapered portion between the source and drain, the channel region is defined by the gate and the tapered portion of the first active region, and the gate is a conductor of a first predetermined width overlying at least a portion of the tapered portion of the first active region to define the channel region;

a second transistor formed in a second active region having a source, a drain, a gate, and a channel region, wherein the second active region has a tapered portion between the source and drain, the channel region is defined by the gate and the tapered portion of the second active region, and the gate is a conductor of a second predetermined width greater than said first predetermined width overlying at least a portion of the tapered portion of the second active region to define the channel region; and a third transistor formed in a third active region having a source, a drain, a gate, and a channel region, wherein the third active region has a tapered portion between the source and drain, the channel region is defined by the gate and the tapered portion of the third active region, and the gate is a conductor of a third predetermined width greater than said second predetermined width overlying at least a portion of the tapered portion of the third active region to define the channel region;

wherein the tapered portions of the first, second, and third active regions have the same shape and dimensions.

* * * * *

UNITED STATES PATENT AND TRADEMARK OFFICE
CERTIFICATE OF CORRECTION

PATENT NO. : 4,546,453

DATED : October 8, 1985

INVENTOR(S) : Glenn E. Noufer

It is certified that error appears in the above-identified patent and that said Letters Patent is hereby corrected as shown below:

Claim 1, line 1, change "tansistor" to --transistor--.

*Signed and Sealed this*

*Seventeenth* Day of *December 1985*

[SEAL]

*Attest:*

DONALD J. QUIGG

*Attesting Officer*   *Commissioner of Patents and Trademarks*